United States Patent
Ramorini

(10) Patent No.: US 12,273,030 B2
(45) Date of Patent: Apr. 8, 2025

(54) CURRENT SENSING CIRCUIT AND CORRESPONDING DC-DC CONVERTER

(71) Applicant: STMicroelectronics S.r.l., Agrate Brianza (IT)

(72) Inventor: Stefano Ramorini, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 221 days.

(21) Appl. No.: 17/963,534

(22) Filed: Oct. 11, 2022

(65) Prior Publication Data
US 2023/0127446 A1 Apr. 27, 2023

(30) Foreign Application Priority Data
Oct. 20, 2021 (IT) .................. 102021000026927

(51) Int. Cl.
  H02M 3/158 (2006.01)
  G01R 15/14 (2006.01)
  H02M 1/00 (2007.01)

(52) U.S. Cl.
  CPC .......... *H02M 3/158* (2013.01); *G01R 15/146* (2013.01); *H02M 1/0009* (2021.05)

(58) Field of Classification Search
  CPC ............ H02M 3/00; H02M 3/02; H02M 3/04; H02M 3/135; H02M 3/155; H02M 3/1552; H02M 3/156; H02M 3/158; H02M 3/1582; H02M 3/1584; H02M 3/1588; H02M 1/0009; H02M 1/0025; H02M 1/0038; G01R 15/00; G01R 15/14; G01R 15/146; G01R 19/00; G01R 19/0069; G01R 19/0092; G05F 1/10; G05F 1/46; G05F 1/461; G05F 1/56; G05F 1/561; G05F 1/563; G05F 1/565; G05F 1/62
(Continued)

(56) References Cited

U.S. PATENT DOCUMENTS

| | | | |
|---|---|---|---|
| 2014/0253062 A1* | 9/2014 | Qin .......................... | G05F 1/10 323/282 |
| 2015/0280558 A1 | 10/2015 | Lopata et al. | |
| 2019/0068046 A1 | 2/2019 | Xue | |

OTHER PUBLICATIONS

IT Search Report and Written Opinion for priority application, IT Appl. 102021000026927, report dated May 30, 2022, 110 pgs.
(Continued)

*Primary Examiner* — Harry R Behm
*Assistant Examiner* — Carlos O Rivera-Perez
(74) *Attorney, Agent, or Firm* — Crowe & Dunlevy LLC

(57) ABSTRACT

A power switch current sensing circuit includes matching first and second transistors having sources connected to first and second terminals, respectively, of the power switch. A current mirror has a first node coupled to a drain of the first transistor and a second node coupled to a drain of the second transistor. The current mirror sinks a current from the first node equal to a current flowing through the second transistor. A biasing circuit provides a same biasing voltage to the control terminals of the first and second transistors. An output resistance is coupled between the first node and a reference voltage node. A difference between a current flowing through the first transistor and the current sunk by the current mirror circuit from the first node flows through the output resistance. An output voltage produced at the first node is indicative of the current flowing through the power switch.

17 Claims, 5 Drawing Sheets

(58) Field of Classification Search
USPC ............... 323/222–226, 259, 271–278, 280, 323/282–285, 304, 311–317, 351
See application file for complete search history.

(56) References Cited

OTHER PUBLICATIONS

Hong Woojin et al: "A 10-MHz Current-Mode AOT Boost Converter With Dual-Ramp Modulation Scheme and Translinear Loop-Based Current Sensor for WiFi IoT Applications", IEEE Journal of Solid-State Circuits, IEEE, USA, vol. 56, No. 8, Jan. 11, 2021, pp. 2388-2401, XP011869854.

Juang Yi-Wei et al: "A Four-Phase Buck Converter With Capacitor-Current-Sensor Calibration for Load-Transient- Response Optimization That Reduces Undershoot/Overshoot and Shortens Settling Time to Near Their Theoretical Limits", IEEE Journal of Solid-State Circuits, IEEE, USA, vol. 53, No. 2, Feb. 1, 2018, pp. 552-568, XP011676258.

* cited by examiner

FIG. 8
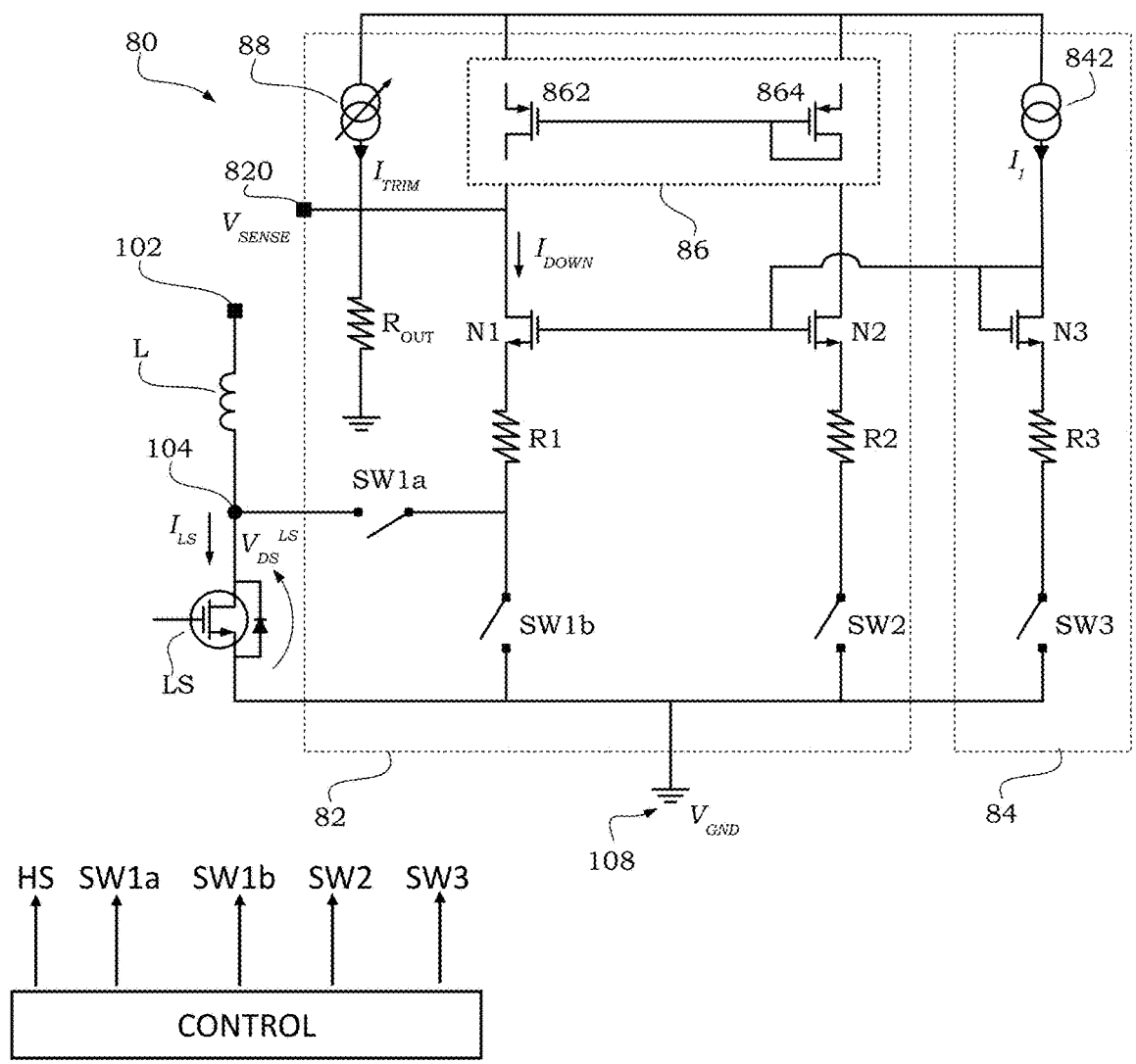
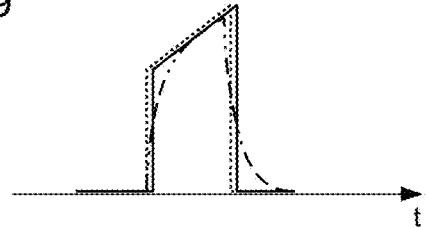
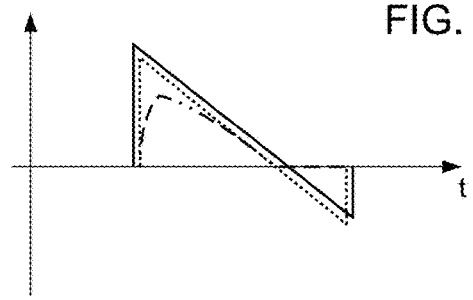
FIG. 9
FIG. 10

CURRENT SENSING CIRCUIT AND CORRESPONDING DC-DC CONVERTER

PRIORITY CLAIM

This application claims the priority benefit of Italian Application for Patent No. 102021000026927, filed on Oct. 20, 2021, the content of which is hereby incorporated by reference in its entirety to the maximum extent allowable by law.

TECHNICAL FIELD

The description relates to a current sensing circuit that may be used, for instance, in a DC-DC converter.

BACKGROUND

Operation of certain DC-DC converters known in the art relies on current control algorithms (e.g., peak current control or valley current control). For a current control algorithm to be carried out, a current sensing circuit is usually provided in the DC-DC converter to sense and reproduce the waveform of the current flowing through the power switch(es) of the converter.

As exemplified in FIG. 1, the current $I_{SW}$ flowing through a power switch of a converter typically has a trapezoidal waveform (i.e., each current pulse comprises a steep rising edge RE, a linear portion LP that can be increasing or decreasing, and a steep falling edge FE). Accurately sensing the current $I_{SW}$ may thus be challenging due to the high frequency components of the current signal. In particular, the edges RE and FE of the current signal $I_{SW}$ may be difficult to sense (e.g., track) if the current sensing circuit has a limited bandwidth.

Certain current sensing circuits with wide bandwidth are known in the art. However, those solutions may be affected by one or more disadvantages such as a high quiescent current consumption, a large silicon area occupation, and/or the inability of sensing bidirectional currents (i.e., the inability of sensing both positive and negative currents in a same branch).

Therefore, there is a need in the art to provide improved current sensing circuits having wide bandwidth, which aim at mitigating (e.g., overcoming) one or more of the disadvantages of the known solutions.

SUMMARY

One or more embodiments may relate to a circuit.

One or more embodiments may relate to a corresponding DC-DC converter.

In one or more embodiments, a first transistor has a source terminal configured to be selectively coupled to a first terminal of an electronic power transistor switch, and a second transistor has a source terminal configured to be selectively coupled to a second terminal of the electronic power transistor switch. The second transistor has the same dimensions of the first transistor. A current mirror circuit is coupled between a first node and a second node. A drain terminal of the first transistor is connected to the first node and a drain terminal of the second transistor is connected to the second node. The current mirror circuit is configured to sink from the first node a current equal to the current flowing through the second transistor. A biasing circuit is coupled to the first transistor and to the second transistor and is configured to provide a same biasing voltage to a control terminal of the first transistor and to a control terminal of the second transistor. An output resistance is coupled between the first node and a reference voltage node, so that a difference between a current flowing through the first transistor and the current sunk by the current mirror circuit from the first node flows through the output resistance and produces at the first node an output voltage signal indicative of the current flowing through the electronic power transistor switch.

One or more embodiments thus facilitate accurately sensing the current flowing through a power switch with wide bandwidth.

In one or more embodiments, a current generator circuit may be arranged to inject an offset current into the output resistance. A positive offset may be thus produced in the output voltage signal.

In one or more embodiments, a first switch and a first resistive element may be arranged in series between the source terminal of the first transistor and the first terminal of the electronic power transistor switch. A second switch and a second resistive element may be arranged in series between the source terminal of the second transistor and the second terminal of the electronic power transistor switch. The first switch may be controllable to be closed in response to the electronic power transistor switch being conductive and opened in response to the electronic power transistor switch being non-conductive. The first switch, the second switch, the first resistive element, the second resistive element and the current mirror circuit may be dimensioned so that the same amount of current flows through the first transistor and the second transistor when the current flowing through the electronic power transistor switch is null.

In one or more embodiments, the first switch and the second switch may have the same conductivity when in the closed state; the first resistive element and the second resistive element may have the same resistance value; and the current mirror circuit may have a 1:1 mirroring ratio.

In one or more embodiments, a resistance value of the first resistive element and the second resistive element may be greater than the reciprocal of a transconductance value of the first transistor and the second transistor, optionally at least ten times greater, optionally at least twenty times greater.

In one or more embodiments, the biasing circuit may comprise a third transistor arranged in a transdiode (i.e., diode-connected transistor) configuration and arranged in series to a biasing current generator. The biasing circuit may comprise a third switch and a third resistive element arranged in series between a source terminal of the third transistor and the second terminal of the electronic power transistor switch. A control terminal of the third transistor may be coupled to a control terminal of the first transistor and to a control terminal of the second transistor.

In one or more embodiments, the third transistor may have the same dimensions of the first transistor. The first switch, the second switch and the third switch may have the same conductivity when in the closed state. The first resistive element, the second resistive element and the third resistive element may have the same resistance value.

In one or more embodiments, a fourth switch may be arranged between the second terminal of the electronic power transistor switch and a node intermediate the first switch and the first resistive element. The fourth switch may be controllable to be closed in response to the electronic power transistor switch being non-conductive and opened in response to the electronic power transistor switch being conductive.

In one or more embodiments, the current mirror circuit may comprise an enhanced cascode current mirror circuit. A first mirror transistor may have a drain terminal coupled to the first node. A second mirror transistor may be arranged in series to the first mirror transistor and may have a drain terminal coupled to the source terminal of the first mirror transistor. A third mirror transistor may have a drain terminal coupled to the second node. A fourth mirror transistor may be arranged in series to the third mirror transistor and may have a drain terminal coupled to the source terminal of the third mirror transistor. The gate terminal of the first mirror transistor may be connected to the gate terminal of the third mirror transistor, the gate terminal of the second mirror transistor may be connected to the gate terminal of the fourth mirror transistor, and the gate terminal of the fourth mirror transistor may be connected to the second node.

In one or more embodiments, the enhanced cascode current mirror circuit may include a first mirror resistance coupled in series to the second mirror transistor and a second mirror resistance coupled in series to the fourth mirror transistor. The first mirror resistance and the second mirror resistance may optionally have the same resistance value.

In one or more embodiments, the biasing current generator may include a cascode current generator comprising a tracking transistor arranged in a transdiode configuration and having a gate terminal connected to the gate terminals of the first mirror transistor and the third mirror transistor.

In one or more embodiments, a DC-DC converter may comprise an electronic power transistor switch arranged between an input node of the converter and an output node of the converter. A current sensing circuit according to one or more embodiments may be coupled to the electronic power transistor switch of the converter. A control circuit of the converter may be configured to operate the electronic power transistor switch, couple the source terminal of the first transistor to the first terminal of the electronic power transistor switch in response to the electronic power transistor switch being conductive, and decouple the source terminal of the first transistor from the first terminal of the electronic power transistor switch in response to the electronic power transistor switch being non-conductive.

In one or more embodiments, the control circuit may be further configured to couple the source terminal of the first transistor to the second terminal of the electronic power transistor switch in response to the electronic power transistor switch being non-conductive, and decouple the source terminal of the first transistor from the second terminal of the electronic power transistor switch in response to the electronic power transistor switch being conductive.

BRIEF DESCRIPTION OF THE DRAWINGS

One or more embodiments will now be described, by way of example only, with reference to the annexed figures, wherein:

FIG. 8 is a circuit diagram exemplary of a current sensing circuit configured to sense the current flowing through the low-side switch of a DC-DC converter;

FIG. 9 is a time diagram exemplary of a comparison between the waveform of the current flowing through a power switch of a DC-DC converter, the output signal produced by a current sensing circuit as exemplified in FIG. 2 or FIG. 3, and the output signal produced by a current sensing circuit according to FIGS. 6-8; and FIG. 10 is a time diagram exemplary of a comparison between the waveform of the current flowing through a power switch of a DC-DC converter operated in continuous-conduction mode, the output signal produced by a current sensing circuit as exemplified in FIG. 2 or FIG. 3, and the output signal produced by a current sensing circuit according to according to FIGS. 6-8.

DETAILED DESCRIPTION

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular configurations, structures, or characteristics may be combined in any adequate way in one or more embodiments.

The headings/references used herein are provided merely for convenience and hence do not define the extent of protection or the scope of the embodiments.

Throughout the figures annexed herein, unless the context indicates otherwise, like parts or elements are indicated with like references/numerals and a corresponding description will not be repeated for the sake of brevity.

Figure 1:
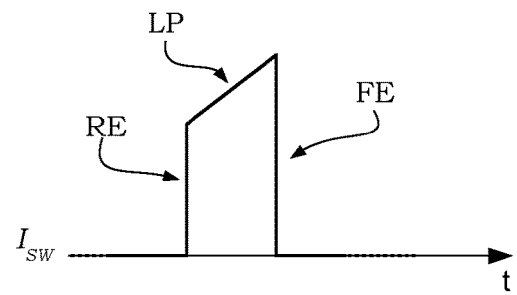
FIG. 1 is a time diagram exemplary of the waveform of the current flowing through a power switch of a DC-DC converter and has already been described in the foregoing.
Figure 2:
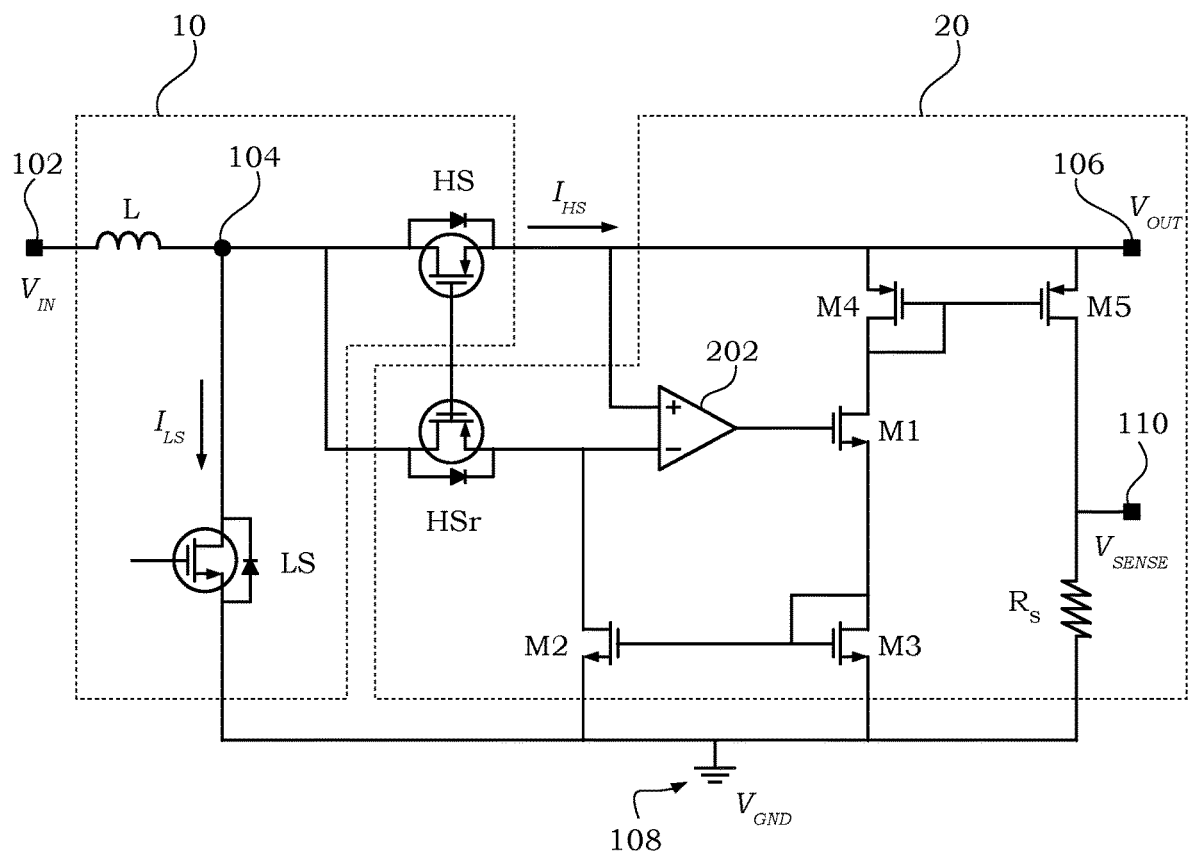
FIG. 2 is a circuit diagram exemplary of a DC-DC converter and a current sensing circuit configured to sense the current flowing through the high-side switch of the converter.

By way of introduction to the detailed description of exemplary embodiments, reference may first be made to FIG. 2, which is a circuit diagram exemplary of a DC-DC boost converter 10 and a related current sensing circuit 20 configured to sense the current flowing through the high-side switch of the converter 10.

The converter 10 comprises an input node 102 configured to receive an input DC voltage VIN. An inductance L (e.g., an inductor) is arranged between the input node 102 and an intermediate node 104 of the converter 10. A high-side switch HS (e.g., a p-channel power MOS transistor) is arranged between the intermediate node 104 and the output node 106 of the converter 10. A low-side switch LS (e.g., an n-channel power MOS transistor) is arranged between the intermediate node 104 and the reference or ground node 108 of the converter 10 that provides a reference voltage $V_{GND}$ (e.g., 0 V). A current $I_{HS}$ flows through the high-side switch HS and a current $I_{LS}$ flows through the low-side switch LS. A capacitor (not visible in FIG. 2) may be coupled between the output node 106 and the reference node 108 to operate the converter 10. The high-side switch HS and the low-side switch LS are controlled by a control unit of the converter 10 (not visible in FIG. 2) according to known control schemes, so that an output DC voltage $V_{OUT}$ is produced at the output node 106.

The current sensing circuit 20 relies on a replica-based architecture with a closed loop in order to sense the waveform of the time-variant current $I_{HS}$ flowing through the high-side switch HS of the converter 10. In particular, the current sensing circuit 20 comprises a replica HSr of the high-side switch HS, coupled between node 104 (e.g., at a drain terminal of the replica power MOS transistor HSr) and the inverting input of an operational amplifier 202 such as an error amplifier (e.g., at a source terminal of the replica transistor HSr). The replica switch HSr is controlled by the same control signal received by the high-side switch HS: the gate terminals of transistors HS and HSr may be coupled one to the other. The non-inverting input of the operational amplifier 202 is coupled downstream of the high-side switch HS (e.g., to the source terminal of transistor HS). The output signal of the operational amplifier 202 controls the conductivity of a first transistor M1, e.g., it is coupled to the gate terminal of an n-channel MOS transistor M1. A first current mirror circuit is arranged between the replica switch HSr, the source terminal of transistor M1 and the reference node 108. In particular, the first current mirror circuit comprises an n-channel MOS transistor M2 having a drain terminal coupled to the inverting input of the operational amplifier 202 and a source terminal coupled to the reference node 108, and an n-channel MOS transistor M3 having a drain terminal coupled to the source terminal of transistor M1 and a source terminal coupled to the reference node 108. The gate terminals of transistors M2 and M3 are connected one to the other and connected to the drain terminal of transistor M3, so that the current flowing through transistors M1 and M3 is mirrored to flow through transistor M2. A second current mirror circuit is arranged between the drain terminal of transistor M1, an output node 110 of the current sensing circuit 20, and the output node 106 of the converter 10. In particular, the second current mirror circuit comprises a p-channel MOS transistor M4 having a drain terminal coupled to the drain terminal of transistor M1 and a source terminal coupled to the output node 106, and a p-channel MOS transistor M5 having a drain terminal coupled to the output node 110 and a source terminal coupled to the output node 106. The gate terminals of transistors M4 and M5 are connected one to the other and connected to the drain terminal of transistor M4, so that the current flowing through transistors M1 and M4 is mirrored to flow through transistor M5. A resistive element $R_S$ is coupled between the output node 110 of the current sensing circuit 20 and the reference node 108, so that the current flowing through transistor M5 and resistance $R_S$ produces a voltage $V_{SENSE}$ at the output node 110 that is indicative of the current $I_{HS}$ flowing through the high-side switch HS of the converter 10.

Figure 3:
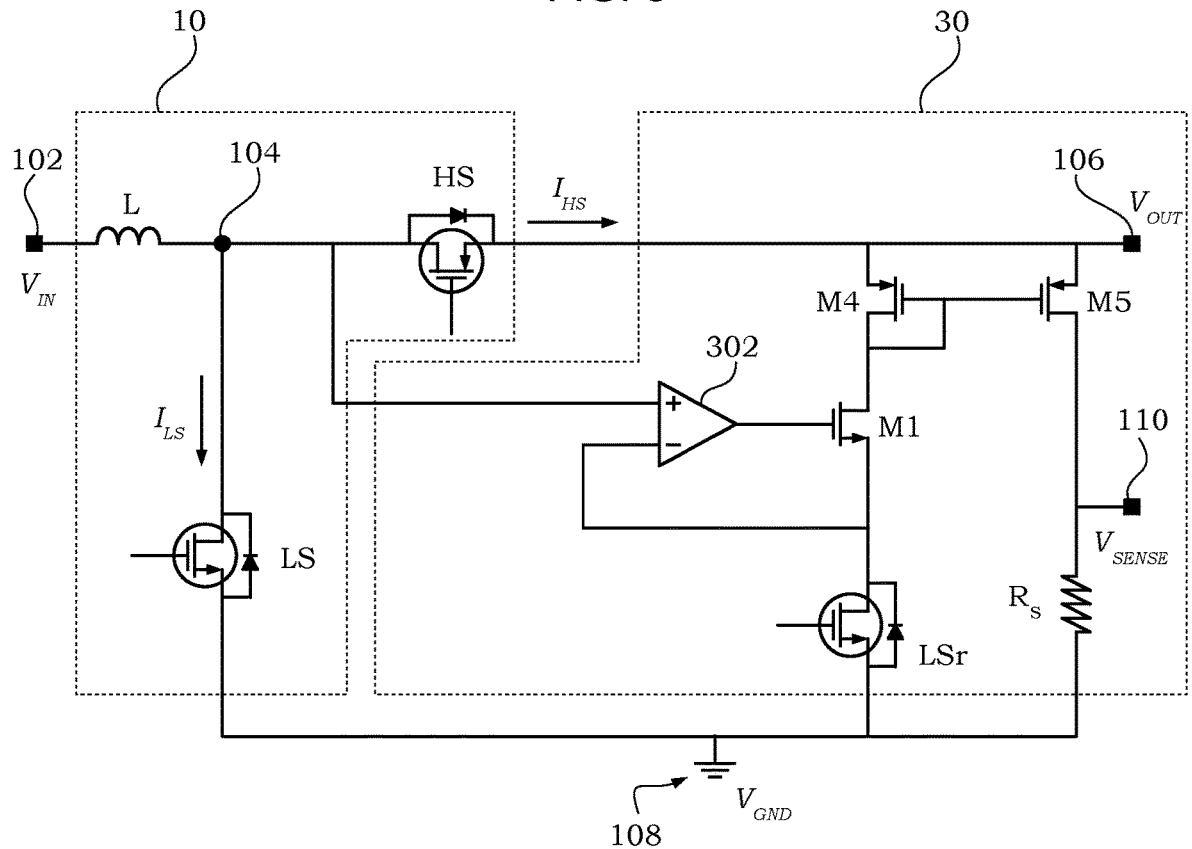
FIG. 3 is a circuit diagram exemplary of a DC-DC converter and a current sensing circuit configured to sense the current flowing through the low-side switch of the converter.

Also by way of introduction, reference may be made to FIG. 3, which is a circuit diagram exemplary of a DC-DC boost converter 10 and a related current sensing circuit 30 configured to sense the current flowing through the low-side switch of the converter 10.

The converter 10 is substantially the same as described with reference to FIG. 2 and comprises the same components HS, LS, L, as well as a capacitor coupled to the output node 106.

The current sensing circuit 30 relies on a replica-based architecture with a closed loop in order to sense the waveform of the time-variant current $I_{LS}$ flowing through the low-side switch LS of the converter 10. In particular, the current sensing circuit 30 comprises a replica LSr of the low-side switch LS, coupled between node 108 (e.g., at a source terminal of the replica power MOS transistor LSr) and the inverting input of an operational amplifier 302 such as an error amplifier (e.g., at a drain terminal of the replica transistor LSr). The replica switch LSr is controlled by the same control signal of the low-side switch LS: despite not being visible in FIG. 3 for the sake of ease of illustration only, the gate terminals of transistors LS and LSr may be coupled one to the other. The non-inverting input of the operational amplifier 302 is coupled upstream of the low-side switch LS (e.g., to the drain terminal of transistor LS). The output signal of the operational amplifier 302 controls the conductivity of the first transistor M1, e.g., it is coupled to the gate terminal of the n-channel MOS transistor M1. The source terminal of transistor M1 is coupled to the inverting input of the operational amplifier 302. A current mirror circuit comprising transistors M4 and M5 is arranged between the drain terminal of transistor M1, the output node 110 of the current sensing circuit 30, and the output node 106 of the converter 10, as described with reference to FIG. 2. Similarly, a resistive element $R_S$ is coupled between the output node 110 of the current sensing circuit 30 and the reference node 108, so that the current flowing through transistor M5 and resistance $R_S$ produces a voltage $V_{SENSE}$ at the output node 110 that is indicative of the current $I_{LS}$ flowing through the low-side switch LS of the converter 10.

The current sensing circuits 20 and 30 exemplified in FIG. 2 and FIG. 3 may have one or more of the drawbacks discussed in the following.

Figure 4:
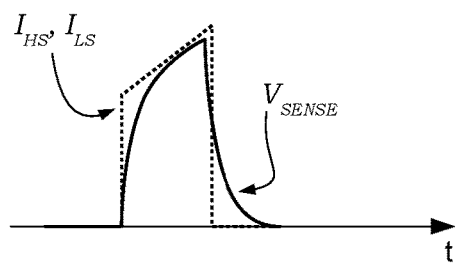
FIG. 4 is a time diagram exemplary of the waveform of the current flowing through a power switch of a DC-DC converter and the output signal produced by a current sensing circuit as exemplified in FIG. 2 or FIG. 3.

A first drawback is that the bandwidth of such current sensing circuits may be limited in order to provide the necessary closed loop stability. This may result in a distortion of the sensed trapezoidal current waveform as exemplified in FIG. 4, which is a time diagram that exemplifies a comparison between the waveform of the current ($I_{HS}$ or $I_{LS}$) flowing through the high-side or low-side switch of the converter 10 and the output signal $V_{SENSE}$ produced by the current sensing circuit 20 or 30. Due to the bandwidth limitation, the output signal $V_{SENSE}$ (solid line in FIG. 4) may be substantially smoothed with respect to the actual current waveform $I_{HS}$ or $I_{LS}$ (dotted line in FIG. 4), resulting in poor accuracy of the current sensing.

In order to increase the bandwidth of the current sensing circuit 20 or 30, the operational amplifier and the replica branch may be biased with a significant current. However, this approach may lead to a second drawback, i.e., a high quiescent current consumption that may not comply with the design constraints of low-power DC-DC converters and/or with the efficiency requirements at light load.

A third drawback is that the current sensing circuit 20 or 30 requires an operational amplifier, a replica switch (e.g., replica transistor) and a replica branch, which result in a high silicon area occupation.

Figure 5:
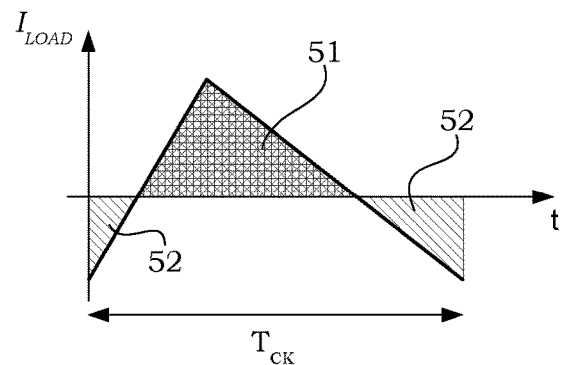
FIG. 5 is a time diagram exemplary of the waveform of the current flowing through the load of a DC-DC converter operated in continuous-conduction mode (CCM)

A fourth drawback is that the current sensing circuit 20 or 30 can only sense a positive current flowing from node 104 to the output node 106 (high-side sensing) or to the reference node 108 (low-side sensing). Reverse (negative) current flowing from the output node 106 (high-side sensing) or from the reference node 108 (low-side sensing) to node 104 cannot be sensed, resulting in a loss of accuracy for DC-DC converters working in forced continuous-conduction mode (CCM) where current inversion at light load takes place. FIG. 5 is a time diagram that exemplifies a portion of the load current $I_{LOAD}$ in light-load CCM that is not sensed over a clock period $T_{CK}$: the positive area 51 is correctly sensed while the negative area 52 is not sensed.

Therefore, one or more embodiments may provide a different current sensing architecture (e.g., for application in DC-DC converters) aiming at mitigating one or more of the drawbacks discussed above.

Figure 6:
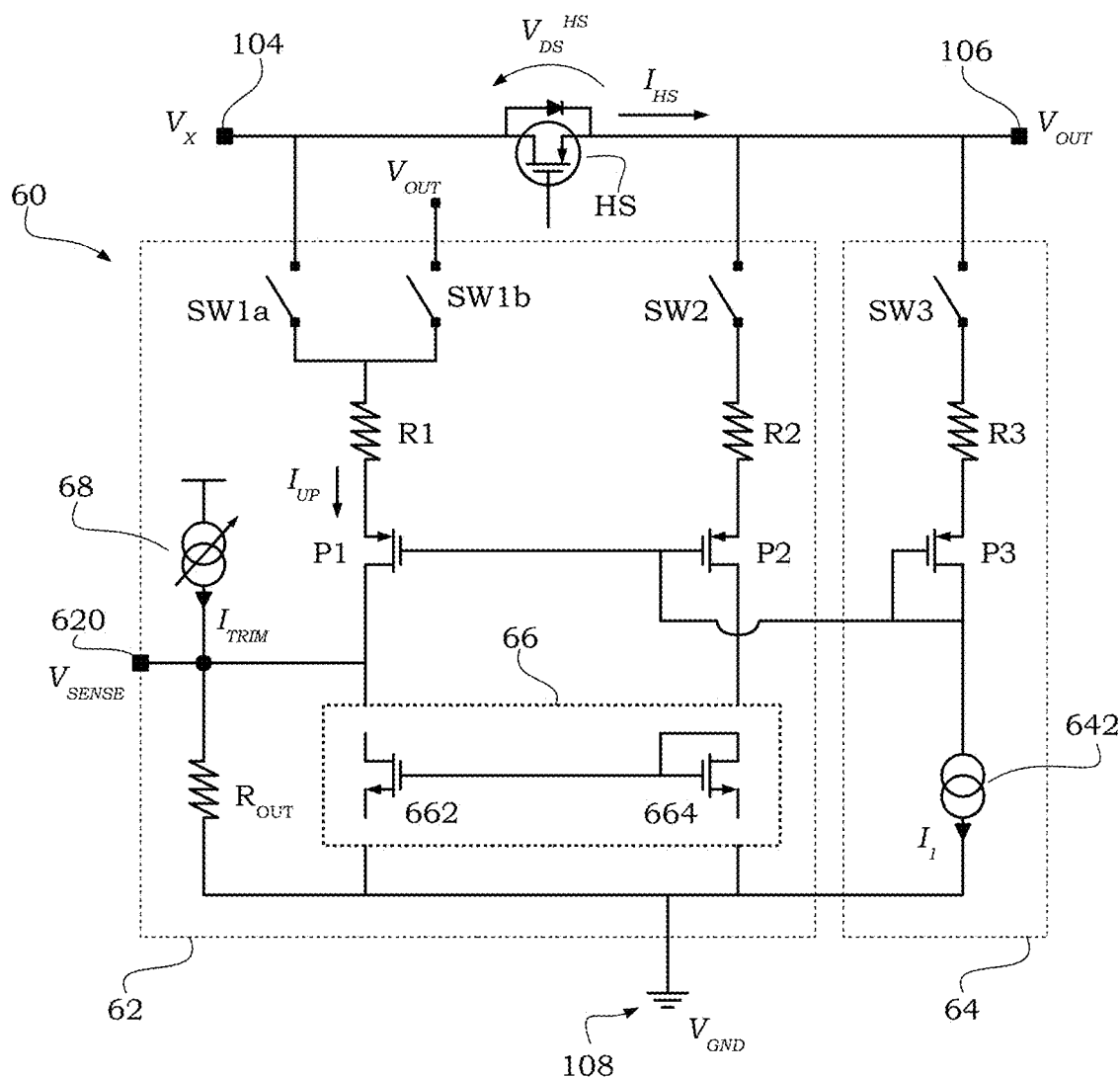
FIG. 6 is a circuit diagram exemplary of a current sensing circuit configured to sense the current flowing through the high-side switch of a DC-DC converter.

FIG. 6 is a circuit diagram exemplary of certain components of a DC-DC boost converter 10 (see, e.g., the high-side switch HS arranged between node 104 and 106) and a related current sensing circuit 60 configured to sense the current flowing through the high-side switch HS of the converter 10. Other components of the converter 10 (e.g., the low-side switch LS, the inductor L and the output capacitor) may be arranged substantially as discussed with reference to FIG. 2, and are not illustrated in FIG. 6 for the sake of ease of illustration only.

The current sensing circuit 60 comprises a sensing circuit 62 (e.g., the "core" of the sensing part) and a biasing circuit 64 (e.g., a reference branch). The sensing circuit 62 is configured to sense the current $I_{HS}$ flowing through the high-side switch HS and to produce, at a respective output node 620, a voltage signal $V_{SENSE}$ indicative of the current $I_{HS}$. The biasing circuit 64 is configured to produce a fixed bias voltage for the sensing circuit 62, as discussed in the following.

The sensing circuit 62 comprises a first transistor P1 (e.g., a p-channel MOS transistor) having a source terminal selectively couplable to the node 104 (e.g., to the drain terminal of transistor HS). For instance, the sensing circuit 62 may comprise a first resistance R1 (e.g., a resistor) coupled between the source terminal of transistor P1 and the first terminal of a switch SW1a. The second terminal of the switch SW1a may be coupled to the node 104. Additionally, the sensing circuit 62 may comprise a second switch SW1b arranged between the resistance R1 and the output node 106, so that the source terminal of transistor P1 may be selectively coupled to the output node 106 (e.g., to the source terminal of transistor HS).

The sensing circuit 62 comprises a second transistor P2 (e.g., a p-channel MOS transistor) having a source terminal couplable to the output node 106 (e.g., to the source terminal of transistor HS). For instance, the sensing circuit 62 may comprise a second resistance R2 (e.g., a resistor) coupled between the source terminal of transistor P2 and the first terminal of a switch SW2. The second terminal of the switch SW2 may be coupled to the output node 106. The gate terminals of transistors P1 and P2 may be coupled one to the other to receive the same bias voltage.

The sensing circuit 62 comprises a current mirror circuit 66 arranged between the drain terminals of transistors P1 and P2 and the reference node 108. In particular, the current mirror circuit 66 may comprise an n-channel MOS transistor 662 having a drain terminal coupled to the drain terminal of transistor P1 (i.e., at node 620) and a source terminal coupled to the reference node 108, and an n-channel MOS transistor 664 having a drain terminal coupled to the drain terminal of transistor P2 and a source terminal coupled to the reference node 108. The gate terminals of transistors 662 and 664 are connected one to the other and connected to the drain terminal of transistor 664 (e.g., to the drain terminal of transistor P2). It will otherwise be noted that a simple current mirror is described herein as an example of a possible implementation, and that any type of suitable current mirror architecture may be implemented in the current mirror circuit 66.

In one or more embodiments, the switches SW1a, SW1b, SW2, the resistors R1, R2, the transistors P1, P2 and the current mirror 66 are dimensioned so as to be matched, in such a way that when no current flows through the high-side switch HS (e.g., because the high-side switch HS is open), the same amount of current flows in both branches of the sensing circuit 62 (i.e., the same current flows through transistors P1 and P2). For instance, in one or more embodiments the switches SW1a, SW1b and SW2 may be substantially equal and may have the same resistance value in the closed state; the resistors R1 and R2 may be substantially equal and may have the same resistance value $R_{IN}$; and the current mirror 66 may have a 1:1 mirroring factor. Alternatively, the resistors R1 and R2 may be different (e.g., their resistance ratio being equal to N) and the current mirror 66 may have a 1:N mirroring factor, so as to compensate for the different values of R1 and R2. Other combinations of the values of resistance of the switches SW1a, SW1b and SW2, as well as of the resistors R1 and R2 and of the mirroring factor of the current mirror 66 are possible, as long as the two branches of the sensing circuit 62 are matched so that transistor 662 is configured to sink from node 620 a current equal to the current flowing through transistor P2.

Additionally, the sensing circuit 62 comprises an output resistance $R_{OUT}$ (e.g., a resistor) coupled between node 620 and the reference node 108. Therefore, a current resulting from the difference between the current flowing through transistor P1 and the current sunk by transistor 662 is forced to flow through resistor $R_{OUT}$ and produces the output signal $V_{SENSE}$. The sensing circuit 62 may additionally comprise a trimmed current generator 68 coupled between a power supply rail (e.g., node 106) and node 620 and configured to inject a current $I_{TRIM}$ into node 620 (and thus through resistor $R_{OUT}$). The current generator 68 may therefore produce an offset voltage $V_{OS}=I_{TRIM} \cdot R_{OUT}$ in the output signal $V_{SENSE}$.

The biasing circuit 64 is configured to produce a fixed bias voltage for the (gate) terminals of transistors P1 and P2. In particular, the biasing circuit 64 may comprise a third transistor P3 (e.g., a p-channel MOS transistor) having a source terminal couplable to the output node 106 (e.g., to the source terminal of transistor HS). For instance, the biasing circuit 64 may comprise a third resistance R3 (e.g., a resistor) coupled between the source terminal of transistor P3 and the first terminal of a switch SW3. The second terminal of the switch SW3 may be coupled to the output node 106. The gate terminal of transistor P3 may be coupled to the gate terminals of transistors P1 and P2 and to the drain terminal of transistor P3 (i.e., P3 may be in a transdiode configuration). The biasing circuit 64 may comprise a current generator circuit 642 arranged between the drain terminal of transistor P3 and the reference node 108. The current generator circuit 642 may be configured to set a fixed current $I_1$ that flows through transistor P3, so that the series arrangement of switch SW3, resistance R3, transistor P3 and circuit 642 between the output node 106 (where the voltage is fixed at $V_{OUT}$) and the reference node 108 (where the voltage is fixed at $V_{GND}$) produces the gate voltage (e.g., biasing voltage) of transistors P1 and P2.

In one or more embodiments as exemplified in FIG. 6, the resistor R3 may be substantially equal to resistors R1 and R2 and may thus have a resistance value $R_{IN}$; the switch SW3 may be substantially equal to switches SW1a and SW2 and may have the same resistance value in the closed state. In such a configuration, the current flowing through transistors P1 and P2 when no current flows through the high-side switch HS may be equal to $I_1$. Alternatively, transistor P3 and resistor R3 may be dimensioned differently from transistors P1, P2 and resistors R1, R2: for instance, with R3>R1 and R3>R2 the current flowing through transistors P1 and P2 may be higher than $I_1$.

The switches SW1a, SW1b may be controlled by a control circuit of the converter 10 (as shown in FIG. 6) that also controls operation of the high-side switch HS. Therefore, switch SW1a may be closed and switch SW1b may be open when the high-side switch HS is closed (e.g., turned ON) and a current IHS flows therethrough, producing a voltage drop VDSHS between node 104 and node 106. Conversely, switch SW1a may be open and switch SW1b may be closed when the high-side switch HS is open (e.g., turned OFF). The switches SW2 and SW3 may be kept permanently closed so as to maintain the sensing circuit 62 supplied also when the high-side switch HS is open (and correctly producing a null output signal VSENSE=VOS). The switches SW2 and SW3 may be dimensioned so as to improve the matching of the current flow lines (or branches) of transistors P1, P2 and P3.

Substantially, the sensing circuit 62 operates as an equivalent differential input stage that includes the series arrangements of P1, R1 and P2, R2. The equivalent transconductance seen from node 104, $g_m^{ER}$, may be computed as $g_m^{EQ} = (1/g_m^P + R_{IN})^{-1}$ where $g_m^P$ is the transconductance of transistors P1 and P2 and $R_{IN}$ is the resistance value of resistors R1 and R2. In one or more embodiments, the value $R_{IN}$ may be much greater than $1/g_m^P$ (e.g., by design) so that $g_m^{EQ} \approx 1/R_{IN}$ (e.g., $R_{IN} > 10 \cdot 1/g_m^P$). The switches SW2 and SW3, possibly kept permanently closed (e.g., their control terminal may be disconnected), provide a good matching between the two branches of the sensing circuit 62 and the biasing circuit 64. As a result of a good matching, the same current $I_{UP}$ flows through the two branches of the sensing circuit 62 when the voltage drop $V_{DS}^{HS}$ across the high-side switch HS is zero (i.e., when $I_{HS}=0$). According to different embodiments, the magnitude of current $I_{UP}$ can be equal to or different from the magnitude of current $I_1$.

Therefore, in one or more embodiments the switch SW1a may be closed and the switch SW1b may be open while the high-side switch HS is in a conductive state, so that a current $I_{UP}$ flows through transistor P1, where $I_{UP}$ can be computed as:

$$I_{UP} = I_1 + V_{DS}^{HS} \cdot g_m^{EQ} I_1 + V_{DS}^{HS}/R_{IN}$$

As a result, the output signal $V_{SENSE}$ at node 620 may be indicative of the current $I_{HS}$ flowing through the high-side switch HS, insofar as the voltage $V_{SENSE}$ depends on the voltage $V_{DS}^{HS}$:

$$V_{SENSE} = I_{TRIM} \cdot R_{OUT} + (I_{UP} - I_1) \cdot R_{OUT}$$

$$V_{SENSE} = I_{TRIM} \cdot R_{OUT} + V_{DS}^{HS} \cdot \left(\frac{R_{OUT}}{R_{IN}}\right) = V_{OS} + G \cdot V_{DS}^{HS}$$

where:

$$V_{OS} = I_{TRIM} \cdot R_{OUT}$$

$$G = \frac{R_{OUT}}{R_{IN}}$$

Therefore, the output voltage $V_{SENSE}$ is the sum of a trimmed offset ($V_{OS}$) plus the voltage $V_{DS}^{HS}$ amplified by a constant gain G. The gain G may also be independent from process, corner and temperature variations insofar as it is a ratio between two resistors of the same type.

When the high-side switch HS is in a non-conductive state (e.g., turned OFF), the switch SW1a can be opened while the switch SW1b can be closed, so that the current $I_{UP}$ and the output voltage $V_{SENSE}$ may have the following values:

$$I_{UP} = I_1$$

$$V_{SENSE} = I_{TRIM} \cdot R_{OUT} = V_{OS}$$

In one or more embodiments, the provision of the trimmed current generator 68 that produces the offset voltage $V_{OS}$ sets the dynamic of the output branch of the current mirror circuit 66, so it facilitates operation of the current mirror circuit 66 as a proper current mirror.

Additionally, by properly setting the value of the offset voltage $V_{OS}$, one or more embodiments may be able to sense also a negative current in the high-side switch HS (i.e., a current flowing from node 106 to node 104). Correct sensing of a negative current $I_{HS}$ may be carried out as long as the value of the output voltage $V_{SENSE}$ is higher than the minimum voltage (e.g., lower threshold) that allows saturation of the output branch of the current mirror circuit 66 (e.g., saturation of transistor 662).

Figure 7:
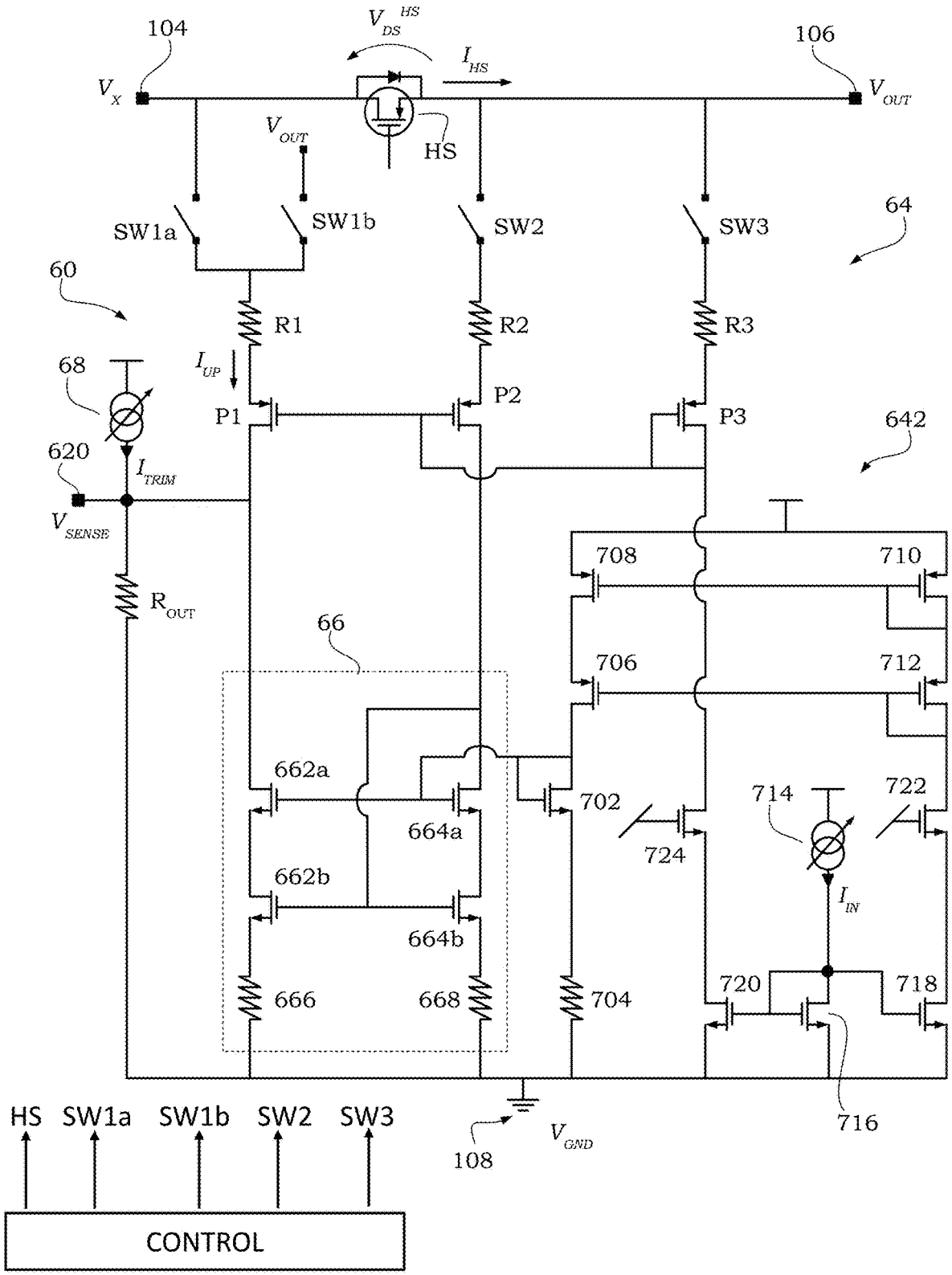
FIG. 7 is a circuit diagram exemplary of implementation details of a high-side current sensing circuit.

FIG. 7 is a circuit diagram exemplary of possible implementation details of a current sensing circuit 60. In particular, FIG. 7 exemplifies details of the current mirror circuit 66 and of the biasing circuit 64.

As exemplified in FIG. 7, in one or more embodiments the current mirror circuit 66 may comprise an enhanced (or improved) cascode current mirror. An n-channel MOS transistor 662a has a drain terminal coupled to the drain terminal of transistor P1 (i.e., at node 620) and a source terminal coupled to the drain terminal of another n-channel MOS transistor 662b. A resistance 666 (e.g., a resistor) is coupled between the source terminal of the transistor 662b and the reference node 108. An n-channel MOS transistor 664a has a drain terminal coupled to the drain terminal of transistor P2 and a source terminal coupled to the drain terminal of another n-channel MOS transistor 664b. A resistance 668 (e.g., a resistor) is coupled between the source terminal of the transistor 664b and the reference node 108. Resistances 666 and 668 may be equal. The gate terminals of transistors 662a and 664a are connected one to the other. The gate terminals of transistors 662b and 664b are connected one to the other and connected to the drain terminal of transistor 664a (i.e., to the drain terminal of transistor P2). Again, the enhanced current mirror 66 and the components P1, P2, R1, R2, SW1a, SW1b and SW2 may be dimensioned so as to provide two matched branches in the sensing circuit 62, so that the current mirror 66 is configured to sink from node 620 a current equal to the current flowing through transistor P2. Implementing the current mirror circuit 66 as an enhanced cascode current mirror as exemplified in FIG. 7 may facilitate reducing the error of the current mirror as a function of voltage $V_{SENSE}$ and/or extending the dynamic of the output voltage $V_{SENSE}$ towards ground. Additionally, the resistors 666, 668 used for degenerating the current mirror may improve the current mirror matching and may further reduce the error of the current mirror as a function of voltage $V_{SENSE}$.

As exemplified in FIG. 7, in one or more embodiments the biasing circuit 64 may comprise a cascode biasing circuit. A transistor 702 (e.g., an n-channel MOS transistor) in a transdiode configuration has a drain terminal and a gate terminal coupled to the gate terminals of transistors 662a and 664a. A resistance 704 matched (e.g., equal to) resistances 666 and 668 is coupled between the source terminal of transistor 702 and the reference node 108. A cascode current mirror is coupled to the drain terminal of transistor 702 to force a current through transistor 702. In particular, the cascode current mirror comprises a p-channel MOS transistor 706 having a drain terminal coupled to the drain terminal of transistor 702 and a source terminal coupled to the drain terminal of another p-channel MOS transistor 708. The source terminal of transistor 708 is coupled to a supply voltage rail (e.g., node 106). The cascode current mirror comprises a p-channel MOS transistor 710 having a source terminal coupled to the supply voltage rail and a drain terminal coupled to the source terminal of another p-channel MOS transistor 712. The gate terminals of transistors 708 and 710 are coupled one to the other and to the drain terminal of transistor 710. The gate terminals of transistors 706 and 712 are coupled one to the other and to the drain terminal of transistor 712. The cascode biasing circuit may be configured to reduce the mirror error by setting the same drain-source voltage to transistors 708 and 710.

As exemplified in FIG. 7, a current generator circuit 714 is configured to inject a current $I_{IN}$ into the drain terminal of an n-channel transistor 716 in transdiode configuration. An n-channel transistor 718 has a gate terminal coupled to the gate terminal of transistor 716, and is arranged in series to transistors 710 and 712 so that the current $I_{IN}$ is mirrored through transistors 710, 712 and 718 and then further mirrored through transistors 706 and 708. An n-channel transistor 720 has a gate terminal coupled to the gate terminal of transistor 716, and is arranged in series to transistor P3 so that the current $I_{IN}$ is mirrored through transistors 720 and P3. Further n-channel transistors 722 and 724 may be coupled in series to transistors 718 and 720, respectively. The provision of transistor 702 in series to resistance 704 in the arrangement exemplified in FIG. 7 facilitates tracking the corner and temperature variations of the current mirror 66.

Those of skill in the art will understand that the specific arrangement of the biasing circuit 64 disclosed with reference to FIG. 7 is discussed herein purely by way of non-limiting example, insofar as it is one of many possible implementations of a biasing circuit suitable for operation of the current sensing circuit 60.

FIGS. 6 and 7 discussed in the foregoing are exemplary of one or more embodiments configured to sense the current flowing through the high-side switch HS of a DC-DC converter 10. Other embodiments may be configured to sense the current flowing through the low-side switch LS of a DC-DC converter 10 by resorting to a complementary architecture, as exemplified in FIG. 8.

FIG. 8 is a circuit diagram exemplary of certain components of a DC-DC boost converter 10 (see, e.g., the low-side switch LS arranged between nodes 104 and 108 and the inductor L arranged between nodes 102 and 104) and a related current sensing circuit 80 configured to sense the current flowing through the low-side switch LS of the converter 10. Other components of the converter 10 (e.g., the high-side switch HS and the output capacitor) may be arranged substantially as discussed with reference to FIG. 2, and are not illustrated in FIG. 8 for the sake of ease of illustration only. The person skilled in the art will understand that a circuit 80 as exemplified in FIG. 8 is substantially complementary to a circuit 60 as exemplified in FIG. 6 and operates according to the same principles; however, a description of circuit 80 is provided in the following.

The current sensing circuit 80 comprises a sensing circuit 82 (e.g., the "core" of the sensing part) and a biasing circuit 84 (e.g., a reference branch). The sensing circuit 82 is configured to sense the current $I_{LS}$ flowing through the low-side switch LS and to produce, at a respective output node 820, a voltage signal $V_{SENSE}$ indicative of the current $I_{LS}$. The biasing circuit 84 is configured to produce a fixed bias voltage for the sensing circuit 82, as discussed in the following.

The sensing circuit 82 comprises a first transistor N1 (e.g., an n-channel MOS transistor) having a source terminal selectively couplable to the node 104 (e.g., to the drain terminal of transistor LS). For instance, the sensing circuit 82 may comprise a first resistance R1 (e.g., a resistor) coupled between the source terminal of transistor N1 and the first terminal of a switch SW1a. The second terminal of the switch SW1a may be coupled to the node 104. Additionally, the sensing circuit 82 may comprise a second switch SW1b arranged between the resistance R1 and the reference node 108, so that the source terminal of transistor N1 may be selectively coupled to the reference node 108 (e.g., to the source terminal of transistor LS).

The sensing circuit 82 comprises a second transistor N2 (e.g., an n-channel MOS transistor) having a source terminal couplable to the reference node 108 (e.g., to the source terminal of transistor LS). For instance, the sensing circuit 82 may comprise a second resistance R2 (e.g., a resistor) coupled between the source terminal of transistor N2 and the first terminal of a switch SW2. The second terminal of the switch SW2 may be coupled to the reference node 108. The gate terminals of transistors N1 and N2 may be coupled one to the other to receive the same bias voltage.

The sensing circuit 82 comprises a current mirror circuit 86 arranged between the drain terminals of transistors N1 and N2 and a supply voltage node (e.g., node 106, or a chip input supply node, or a regulated voltage produced therefrom). In particular, the current mirror circuit 86 may comprise a p-channel MOS transistor 862 having a drain terminal coupled to the drain terminal of transistor N1 (i.e., at node 820) and a source terminal coupled to the supply voltage node, and a p-channel MOS transistor 864 having a drain terminal coupled to the drain terminal of transistor N2 and a source terminal coupled to the supply voltage node. The gate terminals of transistors 862 and 864 are connected one to the other and connected to the drain terminal of transistor 864 (e.g., to the drain terminal of transistor N2). It will otherwise be noted that a simple current mirror is described herein as an example of a possible implementation, and that any type of suitable current mirror architecture may be implemented in the current mirror circuit 86.

As previously discussed with reference to FIG. 6, in one or more embodiments the switches SW1a, SW1b, SW2, the resistors R1, R2, the transistors N1, N2 and the current mirror 86 are dimensioned so as to be matched, in such a way that when no current flows through the low-side switch LS (e.g., because the low-side switch LS is open), the same amount of current flows in both branches of the sensing circuit 82 (i.e., the same current flows through transistors N1 and N2). For instance, in one or more embodiments the switches SW1a, SW1b and SW2 may be substantially equal and may have the same resistance value in the closed state; the resistors R1 and R2 may be substantially equal and may have the same resistance value $R_{IN}$; and the current mirror 86 may have a 1:1 mirroring factor. Alternatively, the resistors R1 and R2 may be different (e.g., their resistance ratio being equal to N) and the current mirror 86 may have a 1:N mirroring factor, so as to compensate for the different values of R1 and R2. Other combinations of the values of resistance of the switches SW1a, SW1b and SW2, as well as of the resistors R1 and R2 and of the mirroring factor of the current mirror 86 are possible, as long as the two branches of the sensing circuit 82 are matched so that transistor 862 is configured to inject into node 820 a current equal to the current flowing through transistor N2.

Additionally, the sensing circuit 82 comprises an output resistance $R_{OUT}$ (e.g., a resistor) coupled between node 820 and the reference node 108. Therefore, a current resulting from the difference between the current injected by transistor 862 and the current flowing through transistor N1 is forced to flow through resistor $R_{OUT}$ and produces the output signal $V_{SENSE}$. The sensing circuit 82 may additionally comprise a trimmed current generator 88 coupled between a power supply rail and node 820 and configured to inject a current $I_{TRIM}$ into node 820 (and thus through resistor $R_{OUT}$). The current generator 88 may therefore produce an offset voltage $V_{OS} = I_{TRIM} \cdot R_{OUT}$ in the output signal $V_{SENSE}$.

The biasing circuit 84 is configured to produce a fixed bias voltage for the (gate) terminals of transistors N1 and N2. In particular, the biasing circuit 84 may comprise a third transistor N3 (e.g., an n-channel MOS transistor) having a source terminal couplable to the reference node 108 (e.g., to the source terminal of transistor LS). For instance, the biasing circuit 84 may comprise a third resistance R3 (e.g., a resistor) coupled between the source terminal of transistor N3 and the first terminal of a switch SW3. The second terminal of the switch SW3 may be coupled to the reference node 108. The gate terminal of transistor N3 may be coupled to the gate terminals of transistors N1 and N2 and to the drain terminal of transistor N3 (i.e., N3 may be in a transdiode configuration). The biasing circuit 84 may comprise a current generator circuit 842 arranged between the drain terminal of transistor N3 and the supply voltage node. The current generator circuit 842 may be configured to set a fixed current $I_1$ that flows through transistor N3, so that the series arrangement of circuit 842, transistor N3, resistance R3 and switch SW3 between the supply voltage node and the reference node 108 (where the voltage is fixed at $V_{GND}$) produces the gate voltage (e.g., biasing voltage) of transistors N1 and N2.

In one or more embodiments as exemplified in FIG. 8, the resistor R3 may be substantially equal to resistors R1 and R2 and may thus have a resistance value $R_{IN}$; the switch SW3 may be substantially equal to switches SW1a and SW2 and may have the same resistance value in the closed state. In such a configuration, the current flowing through transistors N1 and N2 when no current flows through the low-side switch LS may be equal to $I_1$. Alternatively, transistor N3 and resistor R3 may be dimensioned differently from transistors N1, N2 and resistors R1, R2: for instance, with R3>R1 and R3>R2 the current flowing through transistors N1 and N2 may be higher than $I_1$.

The switches SW1a, SW1b may be controlled by a control circuit of the converter 10 (as shown in FIG. 8) that also controls operation of the low-side switch LS. Therefore, switch SW1a may be closed and switch SW1b may be open when the low-side switch LS is closed (e.g., turned ON) and a current ILS flows therethrough, producing a voltage drop VDSLS between node 104 and node 108. Conversely, switch SW1a may be open and switch SW1b may be closed when the low-side switch LS is open (e.g., turned OFF). The switches SW2 and SW3 may be kept permanently closed so as to maintain the sensing circuit 82 supplied also when the low-side switch LS is open (and correctly producing a null output signal VSENSE=VOS). The switches SW2 and SW3 may be dimensioned so as to improve the matching of the current flow lines (or branches) of transistors N1, N2 and N3.

Substantially, the sensing circuit 82 operates as an equivalent differential input stage that includes the series arrangements of N1, R1 and N2, R2. The equivalent transconductance seen from node 104, $g_m^{EQ}$, may be computed as $g_m^{EQ} = (1/g_m^N + R_{IN})^{-1}$ where $g_m^N$ is the transconductance of transistors N1 and N2 and $R_{IN}$ is the resistance value of resistors R1 and R2. In one or more embodiments, the value $R_{IN}$ may be much greater than $1/g_m^N$ (e.g., by design) so that $g_m^{EQ} \approx 1/R_{IN}$ (e.g., $R_{IN} > 10 \cdot 1/g_m^N$). The switches SW2 and SW3, possibly kept permanently closed (e.g., their control terminal may be disconnected), provide a good matching between the two branches of the sensing circuit 82 and the biasing circuit 84. As a result of a good matching, the same current $I_{DOWN}$ flows through the two branches of the sensing circuit 82 when the voltage drop $V_{DS}^{LS}$ across the low-side switch LS is zero (i.e., when $I_{LS}=0$). According to different embodiments, the magnitude of current $I_{DOWN}$ can be equal to or different from the magnitude of current $I_1$.

Therefore, in one or more embodiments the switch SW1a may be closed and the switch SW1b may be open while the low-side switch LS is in a conductive state, so that a current $I_{DOWN}$ flows through transistor N1, where $I_{DOWN}$ can be computed as:

$$I_{DOWN} = I_1 - V_{DS}^{LS} \cdot g_m^{EQ} = I_1 - V_{DS}^{LS}/R_{IN}$$

As a result, the output signal $V_{SENSE}$ at node 820 may be indicative of the current $I_{LS}$ flowing through the low-side switch LS, insofar as the voltage $V_{SENSE}$ depends on the voltage $V_{DS}^{LS}$.

$$V_{SENSE} = I_{TRIM} \cdot R_{OUT} + (I_1 - I_{DOWN}) \cdot R_{OUT}$$

$$V_{SENSE} = I_{TRIM} \cdot R_{OUT} + V_{DS}^{LS} \cdot \left(\frac{R_{OUT}}{R_{IN}}\right) = V_{OS} + G \cdot V_{DS}^{LS}$$

where:

$$V_{OS} = I_{TRIM} \cdot R_{OUT}$$

$$G = \frac{R_{OUT}}{R_{IN}}$$

Therefore, the output voltage $V_{SENSE}$ is the sum of a trimmed offset ($V_{OS}$) plus the voltage $V_{DS}^{LS}$ amplified by a constant gain G. The gain G may also be independent from process, corner and temperature variations insofar as it is a ratio between two resistors of the same type.

When the low-side switch LS is in a non-conductive state (e.g., turned OFF), the switch SW1a can be opened while the switch SW1b can be closed, so that the current $I_{DOWN}$ and the output voltage $V_{SENSE}$ may have the following values:

$$I_{DOWN} = I_1$$

$$V_{SENSE} = I_{TRIM} \cdot R_{OUT} = V_{OS}$$

In one or more embodiments, the provision of the trimmed current generator 88 that produces the offset voltage $V_{OS}$ sets the dynamic of the output branch of the current mirror circuit 86, so it facilitates operation of the current mirror circuit 86 as a proper current mirror. Additionally, by properly setting the value of the offset voltage $V_{OS}$, one or more embodiments may be able to sense also a negative current in the low-side switch LS (i.e., a current flowing from node 108 to node 104). Correct sensing of a negative current $I_{LS}$ may be carried out as long as the value of the output voltage $V_{SENSE}$ is higher than the minimum voltage (e.g., lower threshold) that allows saturation of the output branch of the current mirror circuit 86 (e.g., saturation of transistor 862).

One or more embodiments as exemplified herein thus rely on an open loop current sensing architecture having no constraints as to the loop stability. As a result, the bandwidth of the current sensing circuit is not limited by design constraints and, at least at first approximation, is (only) limited by parasitic capacitances at the nodes.

One or more embodiments may advantageously provide an open loop current sensing architecture having a bandwidth that is not limited by design constrains and it is larger than the bandwidth achievable with known closed loop architectures. Tracking of the voltage drop ($V_{DS}$) across the high-side switch HS and/or the low-side switch LS can be more accurate, thus facilitating a more accurate tracking of the waveform of the current flowing in a power switch of a DC-DC converter. FIG. 9 is exemplary of the waveforms of the current $I_{SW}$ flowing through the (high-side or low-side) switch (dotted line), the current sensed by a conventional closed loop architecture (dash-and-dot line), and the current sensed by one or more embodiments as disclosed herein (solid line).

One or more embodiments may advantageously facilitate sensing a current flowing in a power switch in both directions, and may thus prove accurate in CCM at light load conditions, where negative current needs to be sensed. FIG. 10 is exemplary of the waveforms of the current $I_{SW}$ flowing through the (high-side or low-side) switch (dotted line), the current sensed by a closed loop architecture (dash-and-dot line) such as in FIGS. 2-3, and the current sensed by one or more embodiments as shown in FIGS. 6-8 (solid line) in the specific case of CCM operation.

One or more embodiments may advantageously operate at a biasing current lower than the biasing current requested by the closed loop architectures known in the art, where large bandwidth can only be achieved resorting to a significant biasing current. One or more embodiments may thus provide lower quiescent current consumption.

One or more embodiments may additionally result in a lower silicon area occupation if compared to the architectures known in the art, insofar as they may not require a dedicated error amplifier circuit and a replica branch.

It is noted that one or more embodiments of a current sensing circuit as disclosed herein are applicable not only to boost DC-DC converters, but generally to any DC-DC converter topology (e.g., boost, buck, buck-boost, and the like). More generally, it will be understood that one or more embodiments of a current sensing circuit have been disclosed herein with reference to their possible application in DC-DC converters purely by way of non-limiting example. A current sensing circuit according to one or more embodiments can be applied to any application where a time-variant current waveform has to be accurately sensed (e.g., class-D amplifiers or over current protection circuits).

Additionally, it is noted that one or more embodiments have been disclosed herein with reference to CMOS technology. It will be appreciated that one or more embodiments may rely instead on bipolar technology, so that any reference to "source", "drain" and "gate" terminals of "MOS" transistors may also be read as "emitter", "collector" and "base" terminals of "BJT" transistors.

Without prejudice to the underlying principles, the details and embodiments may vary, even significantly, with respect to what has been described by way of example only, without departing from the extent of protection.

The invention claimed is:

1. A circuit, comprising:
    a first transistor having a source terminal configured to be selectively coupled to a first terminal of an electronic power transistor switch through a first resistor;
    a second transistor having a source terminal configured to be selectively coupled to a second terminal of said electronic power transistor switch through a second resistor;
    wherein said first transistor and said second transistor have same dimensions;
    a current mirror circuit coupled between a first node and a second node, wherein a drain terminal of said first transistor is connected to said first node and a drain terminal of said second transistor is connected to said second node, the current mirror circuit being configured to sink a current from said first node equal to a current flowing through said second transistor;
    a biasing circuit coupled to said first transistor and to said second transistor, the biasing circuit configured to provide a same biasing voltage to a control terminal of said first transistor and to a control terminal of said second transistor; and
    an output resistor having a first terminal directly connected to said first node and a second terminal coupled to a reference voltage node;
    wherein an output voltage signal at said first node depends on a voltage between the first and second terminals of the electronic power transistor switch amplified by a constant gain set by a ratio of a resistance value of the output resistor to a resistance value of the first resistor, said output voltage signal being indicative of positive and negative current flowing through said electronic power transistor switch.

2. The circuit of claim 1, comprising a current generator circuit configured to inject an offset current into said first node to produce a positive offset in said output voltage signal.

3. The circuit of claim 1, comprising:
    a first switch and the first resistor coupled in series between the source terminal of said first transistor and the first terminal of said electronic power transistor switch;
    a second switch and the second resistor coupled in series between the source terminal of said second transistor and the second terminal of said electronic power transistor switch;
    wherein said first switch is controllable to be closed when said electronic power transistor switch is conductive and opened when said electronic power transistor switch is non-conductive;
    wherein said first switch, said second switch, said first resistor, said second resistor and said current mirror circuit are dimensioned so that a same amount of current flows through said first transistor and said second transistor when a current flowing through said electronic power transistor switch is null.

4. The circuit of claim 3, wherein:
said first switch and said second switch have a same conductivity when in a closed state;
said first resistor and said second resistor have a same resistance value; and
said current mirror circuit has a 1:1 mirroring ratio.

5. The circuit of claim 3, wherein same resistance values of said first resistor and said second resistor are greater by a factor than a reciprocal of same transconductance values of said first transistor and said second transistor.

6. The circuit of claim 5, wherein the factor is at least ten.

7. The circuit of claim 5, wherein the factor is at least twenty.

8. The circuit of claim 3, wherein said biasing circuit comprises:
a third transistor in a transdiode configuration and arranged in series to a biasing current generator; and
a third switch and a third resistor coupled in series between a source terminal of said third transistor and the second terminal of said electronic power transistor switch; and
wherein a control terminal of said third transistor is coupled to the control terminal of said first transistor and to the control terminal of said second transistor.

9. The circuit of claim 8, wherein:
said third transistor has same dimensions of said first transistor;
said first switch, said second switch and said third switch have a same conductivity when in a closed state; and
said first resistor, said second resistor and said third resistor have a same resistance value.

10. The circuit of claim 8, further comprising a fourth switch coupled between said second terminal of the electronic power transistor switch and a node intermediate said first switch and said first resistor;
wherein said fourth switch is controlled to be closed when said electronic power transistor switch is non-conductive and opened when said electronic power transistor switch being conductive.

11. The circuit of claim 1, wherein said current mirror circuit comprises:
a first mirror transistor having a drain terminal coupled to said first node;
a second mirror transistor coupled in series to the first mirror transistor and having a drain terminal coupled to the source terminal of the first mirror transistor;
a third mirror transistor having a drain terminal coupled to said second node;
a fourth mirror transistor coupled in series to the third mirror transistor and having a drain terminal coupled to the source terminal of the third mirror transistor;
wherein the gate terminal of the first mirror transistor is connected to the gate terminal of the third mirror transistor, the gate terminal of the second mirror transistor is connected to the gate terminal of the fourth mirror transistor, and the gate terminal of the fourth mirror transistor is connected to said second node.

12. The circuit of claim 11, wherein said current mirror circuit further includes a first mirror resistance coupled in series to said second mirror transistor and a second mirror resistance coupled in series to said fourth mirror transistor, the first mirror resistance and the second mirror resistance having a same resistance value.

13. The circuit of claim 11, wherein said biasing current generator includes a cascode current generator comprising a tracking transistor arranged in a transdiode configuration and having a gate terminal connected to the gate terminals of the first mirror transistor and the third mirror transistor.

14. The circuit of claim 1, further comprising a control circuit configured to:
operate said electronic power transistor switch;
couple said source terminal of said first transistor to the first terminal of the electronic power transistor switch in response to said electronic power transistor switch being conductive; and
decouple said source terminal of said first transistor from the first terminal of the electronic power transistor switch in response to said electronic power transistor switch being non-conductive.

15. The circuit of claim 14, wherein said control circuit is further configured to:
couple said source terminal of said first transistor to the second terminal of the electronic power transistor switch in response to said electronic power transistor switch being non-conductive; and
decouple said source terminal of said first transistor from the second terminal of the electronic power transistor switch in response to said electronic power transistor switch being conductive.

16. A DC-DC converter, comprising:
an electronic power transistor switch coupled between an input node and an output node;
a current sensing circuit according to claim 1 coupled to the electronic power transistor switch; and
a control circuit configured to:
operate said electronic power transistor switch;
couple said source terminal of said first transistor to the first terminal of the electronic power transistor switch through the first resistor in response to said electronic power transistor switch being conductive; and
decouple said source terminal of said first transistor from the first terminal of the electronic power transistor switch in response to said electronic power transistor switch being non-conductive.

17. The DC-DC converter of claim 16, wherein said control circuit is further configured to:
couple said source terminal of said first transistor to the second terminal of the electronic power transistor switch through the first resistor in response to said electronic power transistor switch being non-conductive; and
decouple said source terminal of said first transistor from the second terminal of the electronic power transistor switch in response to said electronic power transistor switch being conductive.

* * * * *